(12) United States Patent
Rausch et al.

(10) Patent No.: US 10,333,089 B2
(45) Date of Patent: Jun. 25, 2019

(54) ORGANIC LIGHT-EMITTING DEVICE AND METHOD FOR PRODUCING AN ORGANIC LIGHT-EMITTING DEVICE

(71) Applicant: OSRAM OLED GmbH, Regensburg (DE)

(72) Inventors: Andreas Rausch, Regensburg (DE); Arndt Jaeger, Regensburg (DE); Johannes Rosenberger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 367 days.

(21) Appl. No.: 15/030,360

(22) PCT Filed: Oct. 14, 2014

(86) PCT No.: PCT/EP2014/072003
§ 371 (c)(1),
(2) Date: Apr. 18, 2016

(87) PCT Pub. No.: WO2015/055643
PCT Pub. Date: Apr. 23, 2015

(65) Prior Publication Data
US 2016/0260920 A1 Sep. 8, 2016

(30) Foreign Application Priority Data
Oct. 18, 2013 (DE) .................. 10 2013 017 361

(51) Int. Cl.
| H01L 51/50 | (2006.01) |
| H01L 51/00 | (2006.01) |
| H01L 51/52 | (2006.01) |
| H01L 51/56 | (2006.01) |

(52) U.S. Cl.
CPC ...... *H01L 51/5008* (2013.01); *H01L 51/0078* (2013.01); *H01L 51/504* (2013.01); *H01L 51/5064* (2013.01); *H01L 51/5076* (2013.01); *H01L 51/5278* (2013.01); *H01L 51/56* (2013.01); *H01L 2251/558* (2013.01)

(58) Field of Classification Search
CPC combination set(s) only.
See application file for complete search history.

(56) References Cited

U.S. PATENT DOCUMENTS

| 2010/0288362 | A1 | 11/2010 | Hatwar et al. |
| 2012/0241726 | A1* | 9/2012 | Kijima ............... H01L 51/5278 257/40 |

FOREIGN PATENT DOCUMENTS

| CN | 101281956 A | 10/2008 | |
| CN | 102439746 A | 5/2012 | |
| CN | 102694002 A | 9/2012 | |
| DE | 102010004453 A1 | 7/2011 | |
| EP | 1 978 574 A2 | 10/2008 | |
| JP | 09013024 | * 1/1997 | ............ C09K 11/06 |
| WO | WO-2010/066245 A1 | 6/2010 | |

OTHER PUBLICATIONS

English language translation of JP-09013024, pp. 1-14, Aug. 9, 2018.*
Fukuda, R. et al., "Excited states and electronic spectra of extended tetraazaporphyrins", The Journal of Chemical Physics, 2010, pp. 144316-1-144316-16, vol. 133, American Institute of Physics.
Kaplan, M. L. et al, "The Preparation, Spectral Properties, and X-Ray Structural Features of 2, 3-Naphthalocyanines", Molecular Crystals and Liquid Crystals, 1984, pp. 345-358, vol. 112, Gordon and Breach, Science Publishers, Inc. and OPA Ltd., United States of America.
Kobayashi, N. et al., "Synthesis, Spectroscopy, and Electrochemistry of Tetra-tert-butylated Tetraazapohphyrins, Phthalocyanines, Naphthalocyanines, and Anthracocyanines, together with Molecular Orbital Calculations", Chem. Eur. J., 2004, pp. 6294-6312, vol. 10, Wiley-VCH Verlag GmbH & Co. KgaA, Weinheim.
Kröger, M. et al., "Temperature-independent field-induced charge separation at doped organic/organic interfaces: Experimental modeling of electrical properties", Physical Review B, 2007, pp. 235221-1-235321-8, vol. 75, The American Physical Society.
Lee, T. et al., "High-efficiency stacked white organic light-emitting diodes", Applied Physics Letters, 2008, pp. 043301-1-043301-3, vol. 92, American Institute of Physics.
Liao, L. et al., "Tandem Organic Light-Emitting Diode using Hexaazatriphenylene Hexacarbonitrile in the Intermediate Connector", Advanced Materials, 2008, pp. 324-329, vol. 20, Wiley-VCH Verlag GmbH & Co. KGaA, Weinheim.
Meerheim, R. et al., "Ultrastable and efficient red organic light emitting diodes with doped transport layers", Applied Physics Letters, 2006, pp. 061111-1-061111-3, vol. 89, American Institute of Physics.
Yanagi, H. et al., "Crystal Growth and Molecular Orientation of Vanadylnaphthalocyanine in Thin Films", The Journal of Physical Chemistry, 990, pp. 7056-7061, vol. 94, American Chemical Society.

* cited by examiner

*Primary Examiner* — Alexander C Kollias
(74) *Attorney, Agent, or Firm* — McDermott Will & Emery LLP (57) ABSTRACT

Disclosed is an organic light-emitting, component which comprises a substrate, a first electrode on the substrate, a first organic functional layer stack on the first electrode, a charge carrier-generating layer stack on the first organic functional layer stack, a second organic functional layer stack on the charge carrier-generating layer stack, and a second electrode on the second organic functional layer stack. The charge carrier-generating layer stack comprises at least one hole-transporting layer, one electron-transporting layer and one intermediate layer, wherein the at least one intermediate layer comprises a naphthalocyanine derivative.

13 Claims, 4 Drawing Sheets

ORGANIC LIGHT-EMITTING DEVICE AND METHOD FOR PRODUCING AN ORGANIC LIGHT-EMITTING DEVICE

An organic light-emitting device and method for producing an organic light-emitting device are provided.

Organic light-emitting devices, such as e.g. organic light-emitting diodes (OLEDs) typically have at least one electroluminescent organic layer between two electrodes which are formed as an anode and cathode and by means of which charge carriers, i.e. electrons and holes, can be injected into the electroluminescent organic layer.

Highly efficient and durable OLEDs can be produced by means of conductivity dopings by the use of a p-i-n transition in a similar manner to conventional inorganic light-emitting diodes, such as described e.g. in document R. Meerheim et al., Appl. Phys. Lett. 89, 061111 (2006). In this case, the charge carriers, i.e. the holes and electrons, from the p-doped and n-doped layers are injected in a controlled manner into the intrinsically formed electroluminescent layer, where they form excitons which in the case of radiating recombination lead to the emission of a photon. The higher the injected current, the higher the emitted luminous density. However, the stress increases with the current and luminous density, as a result of which the OLED service life is shortened.

In order to increase the luminous density and to prolong the service life, a plurality of OLEDs can be stacked monolithically one on top of the other, wherein they are electrically connected by means of so-called Charge Generation Layers (CGLs). A CGL consists e.g. of a highly doped p-n transition which serves as a tunnel transition between the stacked emission layers. Such CGLs are described e.g. in M. Kröger et al., Phys. Rev. B 75, 235321 (2007) and T.-W. Lee et al., APL 92, 043301 (2008).

Prerequisites for the use of a CGL in e.g. a white OLED are a simple structure, that is to say, few layers which can be easily processed, a low voltage drop across the CGL, the lowest possible change in the voltage drop across the CGL during operation of the OLED in the intended operating conditions, and the highest possible transmission in the spectral range emitted by the OLED to ensure that absorption losses of the emitted light are avoided.

Known CGLs use for p-doping inorganic materials, e.g. $V_2O_3$, $MoO_3$, $WO_3$, or organic materials, e.g. F4-TCNQ, Cu(I)pFBz or Bi(III)pFBz. For n-doping, organic compounds such as 1,4,5,8,9,11-hexaazatriphenylene, hexacarbonitrile (HAT-CN) or metals having a low work function, e.g. Cs, Li and Mg or compounds thereof (e.g. $Cs_2CO_3$, $Cs_3PO_4$) are used.

It is at least one object of specific embodiments to provide an organic light-emitting device. It is a further object to provide a method for producing an organic light-emitting device.

These objects are achieved by the subject matters in accordance with the independent claims. Advantageous embodiments and developments of the subject matters are characterized in the dependent claims and are also apparent from the following description and the drawings.

An organic light-emitting device is provided which comprises a substrate, a first electrode on the substrate, a first organic functional layer stack on the first electrode, a charge carrier-generating layer stack on the first organic functional layer stack, a second organic functional layer stack on the charge carrier-generating layer stack, and a second electrode on the second organic functional layer stack, wherein the charge carrier-generating layer stack comprises at least one hole-transporting layer, an electron-transporting layer and an intermediate layer, and wherein the at least one intermediate layer comprises a naphthalocyanine derivative.

The term "on" in relation to the arrangement of the layers and layer stacks is intended to refer here and hereinafter a basic sequence and is to be understood to mean that a first layer is either arranged on a second layer such that the layers have a common boundary surface, i.e. they are in direct mechanical and/or electrical contact with one another, or that further layers are disposed between the first layer and the second layer.

The organic functional layer stacks can each comprise layers with organic polymers, organic oligomers, organic monomers, organic small, non-polymeric molecules ("small molecules") or combinations thereof. Furthermore, they can comprise at least one organic light-emitting layer. Suitable materials for the organic light-emitting layer are materials which show a radiation emission by reason of fluorescence or phosphorescence, e.g. Ir-complexes or Pt-complexes, polyfluorene, polythiophene or polyphenylene or derivatives, compounds, mixtures or copolymers thereof. Furthermore, the organic functional layer stacks can each comprise a functional layer which is designed as a hole transport layer, in order to permit an effective hole injection into the at least one light-emitting layer. Materials which can prove to be advantageous for a hole transport layer are e.g. tertiary amines, carbazole derivatives, polyaniline doped with camphorsulfonic acid or polyethylenedioxythiophene doped with polystyrene sulfonic acid. Furthermore, the organic functional layer stacks can each comprise a functional layer which is formed as an electron transport layer. Furthermore, the organic functional layer stacks can also comprise electron-blocking and/or hole-blocking layers.

With regard to the basic structure of an organic light-emitting device, e.g. with regard to the structure, the layer composition and the materials of the organic functional layer stack, reference is made to the document WO 2010/066245 A1 which is hereby expressly incorporated by reference in particular in relation to the structure of an organic light-emitting device.

The substrate can comprise e.g. one or a plurality of materials in the form of a layer, a plate, a film or a laminate which are selected from glass, quartz, synthetic material, metal and silicon wafer. In a particularly preferred manner, the substrate comprises, or consists of, glass, e.g. in the form of a glass layer, glass film or glass plate.

The two electrodes, between which the organic functional layer stacks are arranged, can both be formed e.g. in a translucent manner, so that the light generated in the at least one light-emitting layer between the two electrodes can be radiated in both directions, i.e. in the direction of the substrate and also in the direction away from the substrate. Furthermore, e.g. all of the layers of the organic light-emitting device can be formed in a translucent manner, so that the organic light-emitting device forms a translucent and in particular a transparent OLED. Furthermore, it may also be possible that one of the two electrodes, between which the organic functional layer stacks are arranged, is formed in a non-translucent manner and preferably in a reflective manner, so that the light generated in the at least one light-emitting layer between the two electrodes can be radiated only in one direction through the translucent electrode. If the electrode arranged on the substrate is formed in a translucent manner and if the substrate is also formed in a translucent manner, then this is also referred to as a so-called "bottom emitter", whereas in the case where the electrode arranged remotely from the substrate is formed in a translucent manner, this is referred to as a so-called "top emitter".

The first electrode and the second electrode can comprise, independently of each other, a material which is selected from a group which comprises metals, electrically conductive polymers, transition metal oxides and transparent conductive oxides (TCO). The electrodes can also be layer stacks of a plurality of layers of the same or different metals or of the same or different TCOs.

Suitable metals are e.g. Ag, Pt, Au, Mg, Al, Ba, In, Ca, Sm or Li, as well as compounds, combinations or alloys thereof.

Transparent conductive oxides ("TCO" for short) are transparent, conductive materials, generally metal oxides, such as for example zinc oxide, tin oxide, cadmium oxide, titanium oxide, indium oxide or indium-tin oxide (ITO). In addition to binary metal oxygen compounds, such as e.g. $ZnO$, $SnO_2$ or $In_2O_3$, ternary metal oxygen compounds such as e.g. $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, TCOs do not necessarily correspond to a stoichiometric composition and may also be p- or n-doped.

Furthermore, the organic functional layer stacks of the organic light-emitting device described here comprise a charge carrier-generating layer stack directly adjacent thereto. The term "charge carrier-generating layer stack" describes here and hereinafter a layer sequence which is formed as a tunnel transition and which is formed in general by means of a p-n transition. The charge carrier-generating layer stack which can also be designated as a so-called "charge generation layer" (CGL) is formed in particular as a tunnel transition which can be used for effective charge separation and thus for "generating" charge carriers for the adjoining layers.

For example, the charge carrier-generating layer stack can directly adjoin the organic functional layer stacks.

The hole-transporting layer of the charge carrier-generating layer stack can also be designated as a p-conductive layer and the electron-transporting layer can be designated as an n-conductive layer. The intermediate layer of the charge carrier-generating layer stack can also be designated as a diffusion barrier layer in accordance with the function thereof. It can comprise or consist of a naphthalocyanine derivative.

For example, the intermediate layer can comprise, in addition to the naphthalocyanine derivative, a material of the hole-transporting layer of the charge carrier-generating layer stack and/or a material of the electron-transporting layer of the charge carrier-generating layer stack.

Naphthalocyanine derivatives are characterized by an extended π-electron system and thus by a large chromophoric system. The chromophoric system comprises four condensed aromatic ring systems which are bridged by nitrogen atoms and which are each constructed from at least three condensed aromatic rings.

By means of the annulation of a further aromatic ring in comparison with phthalocyanines, the condensed aromatic ring systems of which are constructed from two condensed aromatic rings, the photophysical properties are surprisingly changed and improved to a great extent in comparison with phthalocyanines. The high chemical and photophysical stability of the phthalocyanines is also retained in the case of the naphthalocyanine derivatives. The photophysical properties of the naphthalocyanine derivatives can influence the emitted spectrum of the organic light-emitting device in a targeted manner. In particular, in comparison with phthalocyanines, the long-wave absorptions are displaced by enlargement of the chromophore system, i.e. a delocalization via the entire molecular skeleton, from the yellow-red spectral range to the infrared and thus invisible spectral range. This signifies a displacement of up to 100 nm which is achieved by this extended delocalization. The high-energy transitions which are in the near UV range are stabilized to a much lesser extent in naphthalocyanine derivatives in comparison with phthalocyanines and therefore do not result in any, or result in only very small, absorption losses in the blue spectral range. Overall, the naphthalocyanine derivatives are thus characterized in that no or virtually no absorption losses occur in the visible spectral range. Like phthalocyanines, the naphthalocyanine derivatives are very stable and aggregate well, that is to say that during vapor deposition they accumulate in the form of platelets on the substrate.

The extended π-electron system causes a displacement of the absorption peak from the yellow-red spectral range to the infrared spectral range and therefore a stabilization of the low-energy electronic states.

Therefore, when a naphthalocyanine derivative is used in the intermediate layer of the charge carrier-generating layer stack, reduced absorption occurs in the spectral range which is emitted by the organic functional layer stack, thus resulting in increased efficiency of the device. This advantage is achieved when the stability of charge carrier-generating layer stack is simultaneously unchanged with respect to phthalocyanines.

The naphthalocyanine derivative can contain a metal or a metal compound. The metal or metal compound can comprise one or a plurality of chemical bonds within the naphthalocyanine derivative. The chemical bonds can be covalent and/or coordinative bonds. For example, the naphthalocyanine derivative can be a complex compound, wherein the metal or the metal of the metal compound constitutes the central atom.

Materials which are selected from a group containing Cu, Ag, Zn, Co, Ni, Fe, Mn, Mg, Ca, Sr, Ba, Al, AlCl, SnO, HfO, ZrO, VO and TiO can be selected as the metal or metal compound. In a preferred manner, the metal or the metal compound is selected from a group of materials containing Cu, Zn, Co, Ni, Fe, SnO, Mn, Mg, VO and TiO. In a particularly preferred manner, the metal or the metal compound is selected from a group of materials containing Cu, Co, TiO, SnO and VO. The naphthalocyanine derivative can thus be present in oxidized form, if a metal oxide, such as e.g. VO, is used. The oxidation can stabilize the naphthalocyanine derivative with respect to the non-oxidized form.

According to a further embodiment, the naphthalocyanine derivative is metal-free.

In one embodiment, the naphthalocyanine derivative has the formula A or B

Formula A

Formula B

$M^1$ is Cu, Ag, Zn, Co, Ni, Fe, Mn, Mg, Ca, Sr, Ba, Al, AlCl, SnO, HfO, ZrO, VO or TiO. In a preferred manner, $M^1$=Cu, Zn, Co, Ni, Fe, SnO, Mn, Mg, VO or TiO. In a particularly preferred manner, $M^1$=Cu, Co, SnO, TiO or VO.

$R^1$ and $R^2$ can each be selected independently of one another to be the same or different. $R^1$ and $R^2$ can be selected from a group which comprises hydrogen, alkyl residues and aryl residues. The alkyl residues can be methyl, ethyl, n-propyl, iso-propyl or tert-butyl residues. The aryl residue can be e.g. a phenyl residue.

Alternatively, $R^1$ and $R^2$, which are arranged in a meta-position with respect to one another, collectively form an aromatic ring system consisting of one, two or three rings. If the ring system is aromatic and consists of two or three rings, $R^1$ and $R^2$ can form a condensed aromatic ring system. For example, $R^1$ and $R^2$ which are arranged in a meta-position with respect to one another form a phenyl, naphthyl, anthracyl or phenantryl ring. The fact that two residues $R^1$ and $R^2$ are arranged in a meta-position with respect to one another means that they are bonded as substituents to a respective C-atom, wherein the two C-atoms, to which $R^1$ and $R^2$ are bonded, are bonded to one another by means of an π-bond within an aromatic ring.

Naphthalocyanine derivatives of the formula A are thus metal-free and naphthalocyanine derivatives of the formula B contain metal.

For example, the naphthalocyanine derivative has one of the following formulas A1, B1, A2 or B2:

Formula A1

Formula B1

-continued

Formula A2

Formula B2

In formulas A1 and B1, $R^1$ and $R^2$ which are arranged in a meta-position with respect to one another form a phenyl residue, i.e. an aromatic ring system consisting of one ring. In formulas A2 and B2, $R^1$ and $R^2$ which are arranged in a meta-position with respect to one another form a naphthyl residue, i.e. an aromatic condensed ring system consisting of two rings. $M^1$ can be selected as indicated for formula B.

In one embodiment, the naphthalocyanine derivative has the formula A or B, where $R^1$ and $R^2$=hydrogen. This then results in the following formulas A3 or B3:

$M^1$ can be selected as indicated for formula B.

Figure 4A:
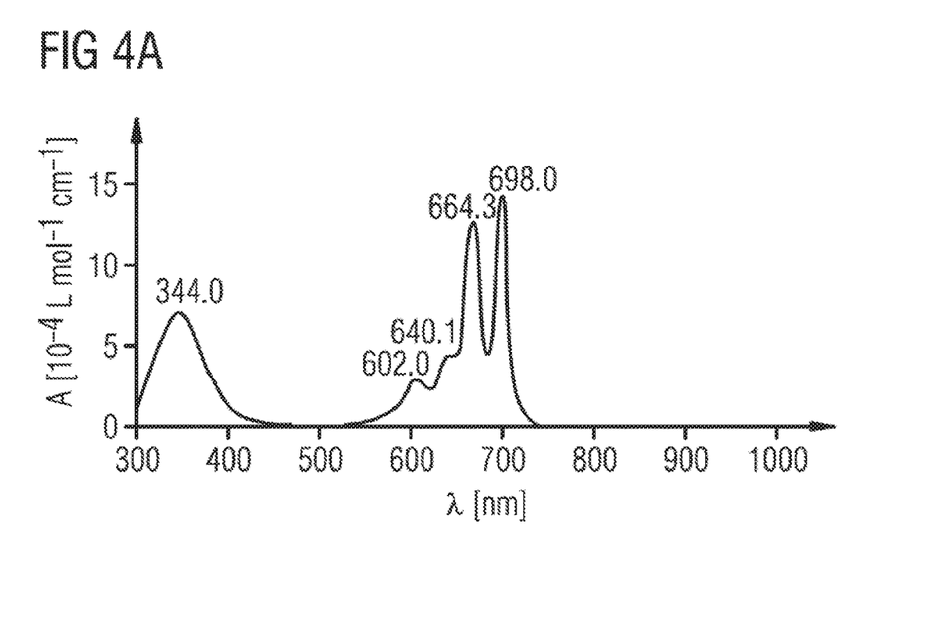
FIG. 4a shows an absorption spectrum of a phthalocyanine.
Figure 4B:
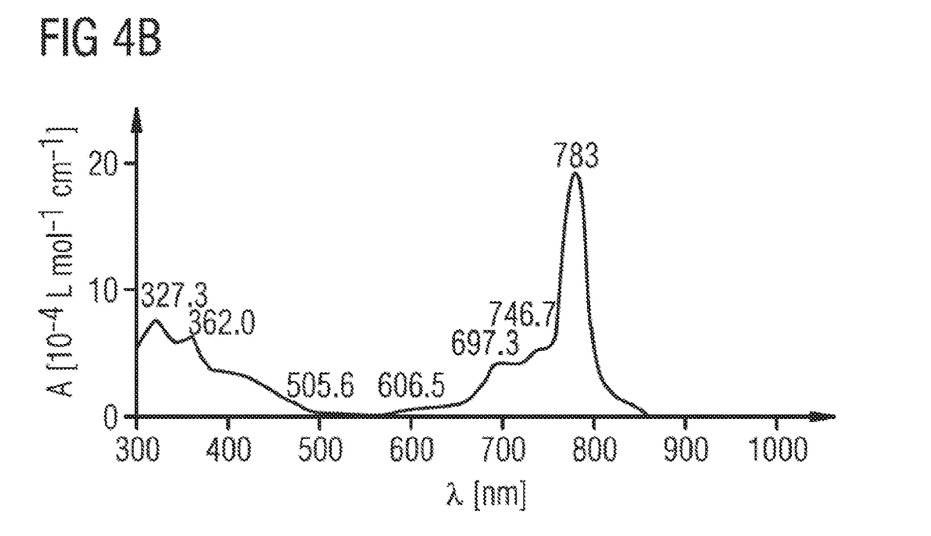
FIG. 4b shows an absorption spectrum of a naphthalocyanine derivative.

The naphthalocyanine derivative of formula A3 has absorption maxima of 783.6 nm, 697.5 nm, 746.7 nm, 606.5 nm, 362.0 nm, 505.6 nm and 327.3 nm. The absorption spectrum of the naphthalocyanine derivative of formula A3 is illustrated in FIG. 4b. In comparison therewith, the absorption spectrum of phthalocyanine has absorption maxima of 698.0 nm, 664.3 nm, 640.1 nm, 602.0 nm and 344.0 nm. The absorption spectrum of phthalocyanine is illustrated in FIG. 4a. The the long-wave absorptions of the phthalocyanine in the visible range are displaced by enlargement of the chromophore system in the naphthalocyanine derivative of formula A3 to the infrared and thus invisible spectral range.

In one embodiment, the naphthalocyanine derivative has the formula B, where $M^1$=Cu, Co, VO. This then results in the following formulas B4, B5 or B6:

Formula B6

$R^1$ and $R^2$ can be selected as indicated for formula B. In a preferred manner, $R^1$ and $R^2$=hydrogen. This then results in the following formulas B7, B8 or B9:

Formula B8

Formula B9

Formula B7

The naphthalocyanine derivative of formula B7 has absorption maxima of 771.2 nm, 684.5 nm and 336.0 nm. In comparison therewith, copper phthalocyanine has absorption maxima of 676.0 nm, 609.0 nm and 345.0 nm. The long-wave absorption of the copper phthalocyanine in the visible range is displaced by enlargement of the chromophore system in the naphthalocyanine derivative of formula B7 to the infrared and thus invisible spectral range.

The naphthalocyanine derivative of formula B8 has absorption maxima of 752.0 nm, 672.5 nm and 340.0 nm. In comparison therewith, cobalt phthalocyanine has absorption maxima of 660.0 nm, 599.0 nm and 332.0 nm. The long-wave absorption of the cobalt phthalocyanine in the visible range is displaced by enlargement of the chromophore system in the naphthalocyanine derivative of formula B8 to the infrared and thus invisible spectral range.

The naphthalocyanine derivative of formula B9 has absorption maxima of 809.6 nm, 719.0 nm and 365.0 nm. In comparison therewith, vanadium oxide phthalocyanine has absorption maxima of 698.0 nm, 630.0 nm and 350.0 nm. The long-wave absorptions of the copper phthalocyanine in the visible range are displaced by enlargement of the chromophore system in the naphthalocyanine derivative of formula B9 to the infrared and thus invisible spectral range.

In one embodiment, the naphthalocyanine derivative has the formula B, where $M^1$=SnO or TiO. This then results in the following formulas B10 and B11:

Formula B10

Formula B11

$R^1$ and $R^2$ can be selected as indicated for formula B. In a preferred manner, $R^1$ and $R^2$=hydrogen. This then results in the following formulas B12 or B13:

Formula B12

Formula B13

The intermediate layer which comprises or consists of the naphthalocyanine derivative can have a thickness which is selected from a range comprising 1 to 50 nm, in particular 2 nm to 10 nm. The thickness of the intermediate layer can be in particular about 4 nm. Intermediate layers which comprise or consist of naphthalocyanine derivatives can be formed in a particularly thick manner because the use of the naphthalocyanine derivative causes no or only very small absorption losses to occur. This applies both to metal-free and also to metal-containing naphthalocyanine derivatives. The thicker the intermediate layer the better the separation of the n-side and p-side, i.e. the separation of the hole-transporting layer and the electron-transporting layer of the charge carrier-generating layer stack.

The transmission of the naphthalocyanine derivatives is advantageously increased in the visible wavelength range, i.e. between about 400 and 700 nm, in comparison with the previously used materials vanadium oxide phthalocyanine, titanium oxide phthalocyanine or NET-39. Therefore, the residual absorption in the organic light-emitting device is reduced specifically in the yellow-red range which, e.g. in the case of white OLEDs, constitutes the main proportion of the emitted radiation. As a consequence, the OLED-efficiency can be increased. In particular, it is thus also possible to increase the efficiency in red OLEDs which emit light in a wavelength range of 600 to 700 nm. Particularly in organic light-emitting devices having internal out-coupling, the multiple reflections which occur in this case make a reduction in the residual absorption in the organic layers crucial in achieving high efficiencies.

The naphthalocyanine derivatives are characterised by the aggregation properties thereof and thus have excellent morphology in the intermediate layer. When naphthalocyanine derivatives are used, thinner intermediate layers can be produced by virtue of the larger molecular structure in comparison with phthalocyanine, which results in a further reduction of absorption losses and in a reduction of voltage losses and thus in an increase in the OLED efficiency.

The hole-transporting layer can be arranged on the intermediate layer which in turn is arranged on the electron-transporting layer.

Furthermore, the hole-transporting layer of the charge carrier-generating layer stack can comprise a first hole-transporting layer and a second hole-transporting layer and the first hole-transporting layer can be arranged on the electron-transporting layer and the second hole-transporting layer can be arranged on the first hole-transporting layer. The intermediate layer can be arranged between the electron-transporting layer and the first hole-transporting layer and/or between the first hole-transporting layer and the second hole-transporting layer. Therefore, either one or two intermediate layers can be present in the charge carrier-generating layer stack and, in the event that only one intermediate layer is present, this layer can be present at two different positions.

The hole-transporting layer, the first and the second hole-transporting layers can be undoped or p-doped independently of one another. The p-doping can comprise e.g. a proportion in the layer of less than 10% by volume, in particular of less than 1% by volume.

The electron-transporting layer can be undoped or n-doped. For example, the electron-transporting layer can be n-doped and the first and second hole-transporting layers can be undoped. Furthermore, the electron-transporting layer can be e.g. n-doped and the second hole-transporting layer can be p-doped.

The hole-transporting layer or the first and second hole-transporting layers can comprise, independently of one another, a material selected from a group comprising HAT-CN, F16CuPc, LG-101, α-NPD, NPB (N,N'-bis(naphthalene-1-yl)-N,N'-bis(phenyl)-benzidine), beta-NPB N,N'-bis(naphthalene-2-yl)-N,N'-bis(phenyl)-benzidine), TPD (N,N'-bis(3-methylphenyl)-N,N'-bis(phenyl)-benzidine), spiro TPD (N,N'-bis(3-methylphenyl)-N,N'-bis(phenyl)-benzidine), spiro-NPB (N,N'-bis(naphthalene-1-yl)-N,N'-bis(phenyl)-spiro), DMFL-TPD N,N'-bis(3-methylphenyl)-N,N'-bis(phenyl)-9,9-dimethyl-fluorene), DMFL-NPB (N,N'-bis(naphthalene-1-yl)-N,N'-bis(phenyl)-9,9-dimethyl-fluorene), DPFL-TPD (N,N'-bis(3-methylphenyl)-N,N'-bis(phenyl)-9,9-diphenyl-fluorene), DPFL-NPB (N,N'-bis(naphthalen-1-yl)-N,N'-bis(phenyl)-9,9-diphenyl-fluorene), spiro-TAD (2,2',7,7'-tetrakis(N,N-diphenylamino)-9,9'-spirobifluorene), 9,9-bis[4-(N,N-bis-biphenyl-4-yl-amino)phenyl]-9H-fluorene, 9,9-bis[4-(N,N-bis-naphthalene-2-yl-amino)phenyl]-9H-fluorene, 9,9-bis[4-(N,N'-bis-naphthalene-2-yl-N,N'-bis-phenyl-amino)-phenyl]-9H-fluorine, N,N'-bis(phenanthrene-9-yl)-N,N'-bis(phenyl)-benzidine, 2,7-bis[N,N-bis(9,9-spiro-bifluorene-2-yl)-amino]-9,9-spiro-bifluorene, 2,2'-bis[N,N-bis(biphenyl-4-yl)amino]9,9-spiro-bifluorene, 2,2'-bis(N,N-di-phenyl-amino)9,9-spiro-bifluorene, di-[4-(N,N-ditolyl-amino)-phenyl]cyclohexane, 2,2',7,7'-tetra(N, N-di-tolyl)amino-spiro-bifluorene, N,N,N',N'-tetra-naphthalene-2-yl-benzidine and mixtures of these compounds.

The first hole-transporting layer can comprise or consist of e.g. HAT-CN.

In the event that the hole-transporting layer or the first and second hole-transporting layers are formed from a substance mixture consisting of matrix and p-dopant, the dopant can be selected from a group comprising $MoO_x$, $WO_x$, $VO_x$, Cu(I) pFBz, Bi(III)pFBz, F4-TCNQ, NPD-2 and NPD-9. The matrix material used can be e.g. one or the plurality of the aforementioned materials for the hole-transporting layer.

The hole-transporting layer or the first and second hole-transporting layers of the charge carrier-generating layer stack can have a transmission which is greater than 90% in a wavelength range of approximately 400 nm to approximately 700 nm, in particular in a wavelength range of 450 nm to 650 nm.

The first and second hole-transporting layers together can have a layer thickness in a range of approximately 1 nm to approximately 500 nm.

The electron-transporting layer can comprise a material which is selected from a group comprising NET-18, 2,2',2''-(1,3,5-benzinetriyl)-tris(1-phenyl-1-H benzimidazole), 2-(4-biphenylyl)-5-(4-tert-butylphenyl)-1,3,4-oxadiazole, 2,9-dimethyl-4,7-diphenyl-1,10-phenanthroline (BCP), 8-hydroxyquinolinolato-lithium, 4-(naphthalene-1-yl)-3,5-diphenyl-4H-1,2,4-triazole, 1,3-bis[2-(2,2'-bipyridine-6-yl)-1,3,4-oxadiazo-5-yl]benzene, 4,7-diphenyl-1,10-phenanthroline (BPhen), 3-(4-biphenylyl)-4-phenyl-5-tert-butylphenyl-1,2,4-triazole, bis(2-methyl-8-quinolinolate)-4-(phenylphenolato) aluminum, 6,6'-bis[5-(biphenyl-4-yl)-1,3,4-oxadiazo-2-yl]-2,2'-bipyridyl,2-phenyl-9,10-di(naphthalene-2-yl)-anthracene, 2,7-bis[2-(2,2'-bipyridine-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalene-2-yl)-4,7-diphenyl-1,10-phenanthroline, 2,9-bis(naphthalene-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f][1,10]phenanthroline, phenyl-dipyrenylphosphine oxide, naphthalene tetracarboxylic acid anhydride and imides thereof, perylene tetracarboxylic acid anhydride and imides thereof, materials based on siloles with a silacyclopentadiene unit and mixtures of the aforementioned substances.

If the electron-transporting layer is formed from a substance mixture consisting of matrix and n-dopant, the matrix can comprise one of the aforementioned materials of the electron-transporting layer. For example, the matrix can comprise or can be NET-18. The n-dopant of the electron-transporting layer can be selected from a group comprising NDN-1, NDN-26, Na, Ca, MgAg, Cs, Li, Mg, $Cs_2CO_3$, and $Cs_3PO_4$.

The electron-transporting layer can have a layer thickness in a range of approximately 1 nm to approximately 500 nm. Furthermore, the electron-transporting layer can also comprise a first electron-transporting layer and a second electron-transporting layer.

Furthermore, the valence band (HOMO=highest occupied molecular orbital) of the material of the electron-transporting layer can be higher than the conduction band (LUMO=lowest unoccupied molecular orbital) of the material of the hole-transporting layer.

In one embodiment, the organic light-emitting device can be formed as an organic light-emitting diode (OLED).

The stated embodiments of the organic light-emitting device can be produced in accordance with the method stated hereinafter. All of the features of the organic light-emitting device stated under the method can also be features of the above-listed exemplified embodiments of the organic light-emitting device.

A method for producing an organic light-emitting device is provided which comprises the method steps of
A) forming a first organic functional layer stack on a first electrode which is arranged on a substrate,
B) forming a charge carrier-generating layer stack on the first organic functional layer stack,
C) forming a second organic functional layer stack on the charge carrier-generating layer stack, and
D) arranging a second electrode on the second organic functional layer stack.

Method step B) comprises the steps of
B1) applying at least one electron-transporting layer on the first organic functional layer stack,
B2) applying a first hole-transporting layer or an intermediate layer on the electron-transporting layer, and
B3) applying an intermediate layer on the first hole-transporting layer and a second hole-transporting layer on the intermediate layer or applying a hole-transporting layer on the intermediate layer, wherein a naphthalocyanine derivative is applied when the intermediate layer is being applied.

The naphthalocyanine derivative can be vapor-deposited or can be applied as a solution. Vapor-deposition is to be understood as vaporization under vacuum and subsequent deposition. Vapor-deposition can be performed e.g. at temperatures ranging from 200° C. to 700° C. For example, the compound of formula A3 can be vaporized at ca. 380° C. under high vacuum.

Furthermore, within method step B), in method step B1) an electron-transporting layer can be applied, in method step B2) an intermediate layer can be applied on the electron-transporting layer and a first hole-transporting layer can be applied on the intermediate layer, and in method step B3) an intermediate layer can be applied on the first hole-transporting layer and a second hole-transporting layer can be applied on the intermediate layer or a second hole-transporting layer can be applied on the first hole-transporting layer.

Further advantages, advantageous embodiments and developments will be apparent from the exemplified embodiments described hereinafter in conjunction with the figures, in which.

In the exemplified embodiments and figures, like or similar elements or elements acting in an identical manner may each be provided with the same reference numerals. The illustrated elements and their size ratios with respect to each other are not to be considered as being to scale; rather individual elements, such as e.g. layers, components, devices and regions, can be illustrated excessively large for improved clarity and/or for improved understanding.

Figure 1A:
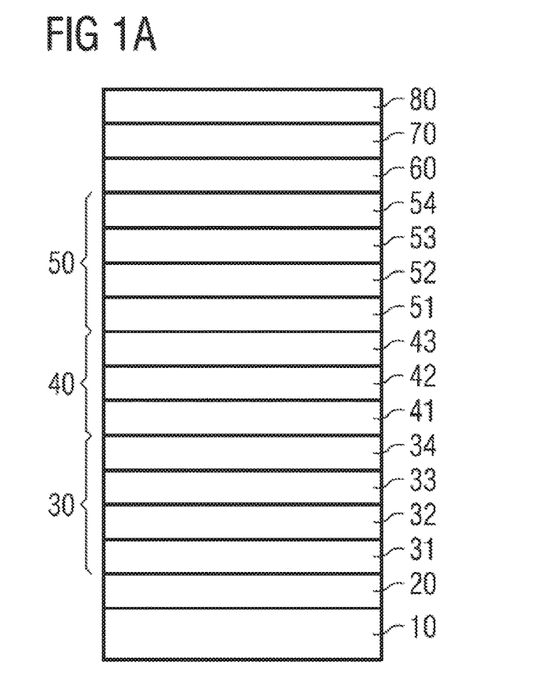
FIGS. 1a to 1c show schematic side views of exemplified embodiments of an organic light-emitting device in accordance with various embodiments.

FIG. 1a shows an exemplified embodiment of an organic light-emitting device. Said device comprises a substrate 10, a first electrode 20, a first organic functional layer stack 30, a charge carrier-generating layer stack 40, a second organic functional layer stack 50, a second electrode 60 and a thin barrier layer 70 and a cover 80. The first organic functional layer stack 30 comprises a hole injection layer 31, a first hole transport layer 32, a first emission layer 33 and an electron transport layer 34. The second organic functional layer stack 50 comprises a second hole transport layer 51, a second emission layer 52, a second electron transport layer 53 and an electron injection layer 54. The charge carrier-generating layer stack 40 comprises an electron-transporting layer 41, an intermediate layer 42 and a hole-transporting layer 43.

The substrate 10 can be used as a carrier element and can be formed e.g. from glass, quartz and/or a semiconductor material. Alternatively, the substrate 10 can also be a synthetic material film or a laminate consisting of a plurality of synthetic material films.

In various embodiments, the device in FIG. 1a can be configured as a top emitter or bottom emitter. Furthermore, it can also be configured as a top and bottom emitter and therefore can be an optically transparent device, e.g. a transparent organic light-emitting diode.

The first electrode 20 can be formed as an anode or cathode and can comprise e.g. ITO as the material. If the device is to be formed as a bottom emitter, the substrate 10 and the first electrode 20 are translucent. In the event that the device is to be formed as a top emitter, the first electrode 20 can preferably also be reflective. The second electrode 60 is formed as a cathode or anode and can comprise e.g. a metal or a TCO. The second electrode 60 can also be translucent if the device is formed as a top emitter.

The thin barrier layer 70 protects the organic layers from damaging materials from the surrounding area, such as e.g. moisture and/or oxygen and/or other corrosive substances such as hydrogen sulfide. For this purpose, the thin barrier layer 70 can comprise one or a plurality of thin layers which are applied e.g. by means of an atomic layer deposition process and which comprise e.g. one or a plurality of the materials aluminum oxide, zinc oxide, zirconium oxide, titanium oxide, hafnium oxide, lanthanum oxide and tantalum oxide. Furthermore, the thin barrier layer 70 comprises mechanical protection in the form of the encapsulation 80 which is formed e.g. as a synthetic material layer and/or as a laminated glass layer, which can provide e.g. scratch-protection.

The emission layers 33 and 52 comprise e.g. an electroluminescent material which is stated in the general part. They can be selected either to be same or different. Furthermore, charge carrier-blocking layers (not shown here) can be provided, between which the organic light-emitting emission layers 33 and 52 are arranged.

For example, the charge carrier-blocking layer can be present in the form of a hole-blocking layer which comprises a material which is selected from a group comprising 2,2',2"-(1,3,5-benzinetriyl)-tris(1-phenyl-1-H-benzimidazole), 2-(4-biphenylyl)-5-(4-tert-butylphenyl)-1,3,4-oxadiazole, 2,9-dimethyl-4,7-diphenyl-1,10-phenanthroline (BCP), 8-hydroxyquinolinolato-lithium, 4-(naphthalene-1-yl)-3,5-diphenyl-4H-1,2,4-triazole, 1,3-bis[2-(2,2'-bipyridine-6-yl)-1,3,4-oxadiazo-5-yl]benzole, 4,7-diphenyl-1,10-phenanthroline (BPhen)l 3-(4-biphenylyl)-4-phenyl-5-tertbutylphenyl-1,2,4-triazole, bis(2-methyl-8-quinolinolate)-4-(phenylphenolato)aluminum, 6,6'-bis[5-(biphenyl-4-yl)-1,3,4-oxadiazo-2-yl]-2,2'-bipyridyl, 2-phenyl-9,10-di(naphthalene-2-yl)-anthracene, 2,7-bis[2-(2,2'-bipyridine-6-yl)-1,3,4-oxadiazo-5-yl]-9,9-dimethylfluorene, 1,3-bis[2-(4-tert-butylphenyl)-1,3,4-oxadiazo-5-yl]benzole, 2-(naphthalene-2-yl)-4,7-diphenyl-1,10-phenanthroline, 2,9-bis(naphthalene-2-yl)-4,7-diphenyl-1,10-phenanthroline, tris(2,4,6-trimethyl-3-(pyridin-3-yl)phenyl)borane, 1-methyl-2-(4-(naphthalene-2-yl)phenyl)-1H-imidazo[4,5-f][1,10]phenanthroline, phenyl-dipyrenylphosphine oxide, naphthalene tetracarboxylic acid dianhydride and imides thereof, perylene tetracarboxylic acid dianhydride and imides thereof, materials based on siloles with a silacyclopentadiene unit, and mixtures thereof.

Furthermore, the charge carrier-blocking layer can be present in the form of an electron-blocking layer which comprises a material which is selected from a group comprising NPB (N,N'-bis(naphthalene-1-yl)-N,N'-bis(phenyl)-benzidine), beta-NPB N,N'-bis(naphthalene-2-yl)-N,N'-bis(phenyl)-benzidine), TPD (N,N'-bis(3-methylphenyl)-N,N'-bis(phenyl)-benzidine), spiro TPD (N,N'-bis(3-methylphenyl)-N,N'-bis(phenyl)-benzidine), spiro-NPB (N,N'-bis(naphthalene-1-yl)-N,N'-bis(phenyl)-spiro), DMFL-TPD N,N'-bis(3-methylphenyl)-N,N'-bis(phenyl)-9,9-dimethyl-fluorene), DMFL-NPB (N,N'-bis(naphthalene-1-yl)-N,N'-bis(phenyl)-9,9-dimethyl-fluorene), DPFL-TPD (N,N'-bis(3-methylphenyl)-N,N'-bis(phenyl)-9,9-diphenyl-fluorene), DPFL-NPB (N,N'-bis(naphthalene-1-yl)-N,N'-bis(phenyl)-9,9-diphenyl-fluorene), spiro-TAD (2,2',7,7'-tetrakis(N,N-diphenylamino)-9,9'-spirobifluorene), 9,9-bis[4-(N,N-bis-biphenyl-4-yl-amino)phenyl]-9H-fluorene, 9,9-bis[4-(N,N-bis-naphthalene-2-yl-amino)phenyl]-9H-fluorene, 9,9-bis[4-(N,N'-bis-naphthalene-2-yl-N,N'-bis-phenyl-amino)-phenyl]-9H-fluorine, N,N'-bis(phenanthrene-9-yl)-N,N'-bis(phenyl)-benzidine, 2,7-bis[N,N-bis(9,9-spiro-bifluorene-2-yl)-amino]-9,9-spiro-bifluorene, 2,2'-bis[N,N-bis(biphenyl-4-yl)amino]9,9-spiro-bifluoren, 2,2'-bis(N,N-diphenyl-amino)9,9-spiro-bifluorene, di-[4-(N,N-ditolyl-amino)-phenyl]cyclohexane, 2,2',7,7'-tetra(N, N-di-tolyl) amino-spiro-bifluorene, N,N,N',N'-tetra-naphthalene-2-yl-benzidine, and mixtures thereof.

Materials for the hole transport layers 32 and 51, for the hole injection layer 31, for the electron transport layers 34 and 53 and for the electron injection layer 54 can be selected from known materials. For example, for the hole transport layers 32 and 51 one or a plurality of the materials which are stated above in relation to the first and second hole-transporting layers can be selected. Furthermore, for the electron transport layers 34 and 53 one or a plurality of the materials which are stated above in relation to the electron-transporting layer can be selected.

In the exemplified embodiment, the charge carrier-generating layer stack 40 contains an electron-transporting layer 41 which contains NET-18 as a matrix material and contains NDN-26 as a dopant and has a thickness of e.g. about 5 nm or 15 nm. The hole-transporting layer 43 comprises HAT-CN as the material and has a layer thickness e.g. of about 5 nm or 15 nm. The intermediate layer 42 has a thickness of about 4 nm and contains a naphthalocyanine derivative as the material, e.g. selected from the compounds shown in the structural formulas A3, B7, B8 or B9.

Figure 1B:
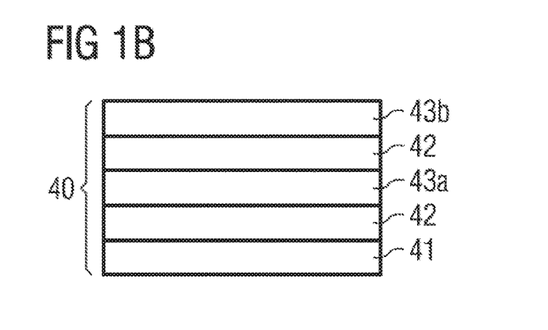

An alternative embodiment of the charge carrier-generating layer stack 40 is shown in FIG. 1b. This charge carrier-generating layer stack comprises the first and second hole-transporting layers 43a and 43b and two intermediate layers 42 which are arranged between the electron-transporting layer 41 and the first hole-transporting layer 43a and between the first hole-transporting layer 43a and the second hole-transporting layer 43b. The first hole-transporting layer 43a can comprise HAT-CN as the material, the second hole-transporting layer 43b can comprise e.g. α-NPD as the material. The materials of the intermediate layers 42 and of the electron-transporting layer 41 correspond to those stated in relation to FIG. 1a.

Figure 1C:
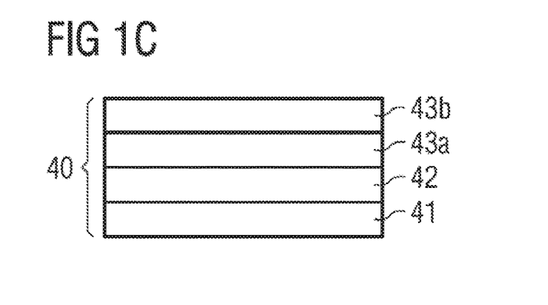

A further embodiment of the charge carrier-generating layer stack 40 is shown in FIG. 1c. In this case, again only one intermediate layer 42 is present which is arranged between the electron-transporting layer 41 and the first hole-transporting layer 43a. In this embodiment, the second hole-transporting layer 43b which is arranged on the first hole-transporting layer 43a can comprise p-doping which has e.g. a proportion of less than 10% by volume, in particular of less than 1% by volume in the layer.

A device as shown in FIGS. 1a to 1c can also comprise further organic functional layer stacks, wherein in each case a charge carrier-generating layer stack 40 is arranged between two organic functional layer stacks and can be configured e.g. in accordance with one of the embodiments, as shown in FIGS. 1a to 1c.

Figure 2:
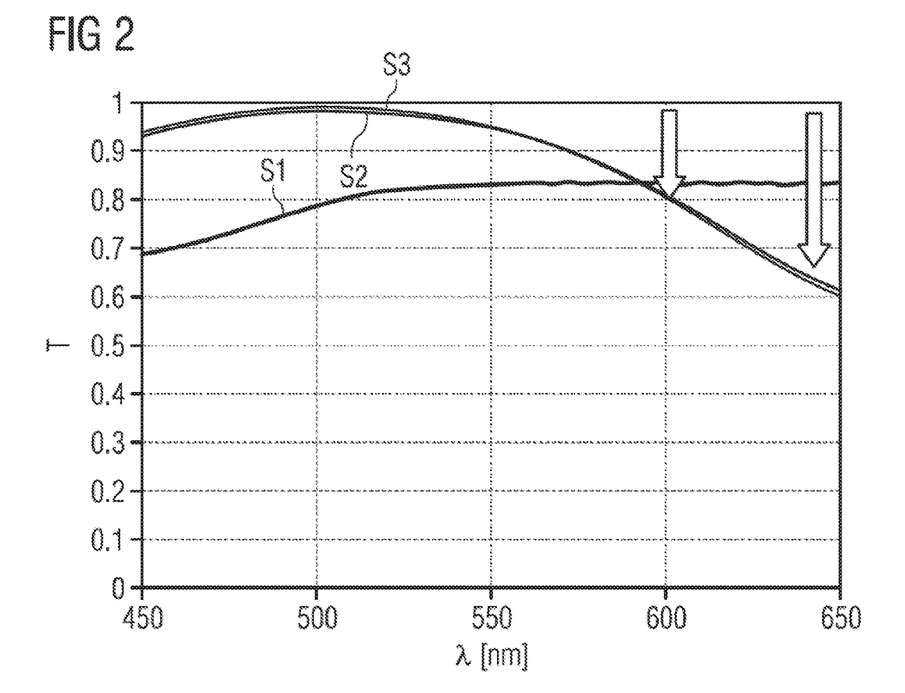
FIG. 2 shows transmission spectra of intermediate layer materials.

FIG. 2 shows an optical transmission spectrum, in which the x-axis represents the wavelength λ in nm and the y-axis represents the transmission T. The example S1 is the transmission of the conventional material NET-39 of an intermediate layer 42, S2 and S3 show the transmission spectra of vanadium oxide phthalocyanine—(S2) and titanium oxide phthalocyanine (S3). It is apparent that the transmission is increased by the use of phthalocyanines in the spectral range of approximately 450 nm to approximately 600 nm in comparison with the transmission of NET-39 in the same spectral range, which can be attributed to the n-electron system of the phthalocyanines. Therefore, in an organic light-emitting device, e.g. an OLED, the residual absorption is specifically reduced in the yellow-green-blue range. By reason of the still additionally enlarged n-electron system in naphthalocyanine derivatives, the corresponding transmission of the naphthalocyanine derivatives can therefore also be further increased in comparison with the phthalocyanines, specifically in the yellow-red range, because the intensive low-molecular absorption bands are displaced to IR.

Figure 3A:
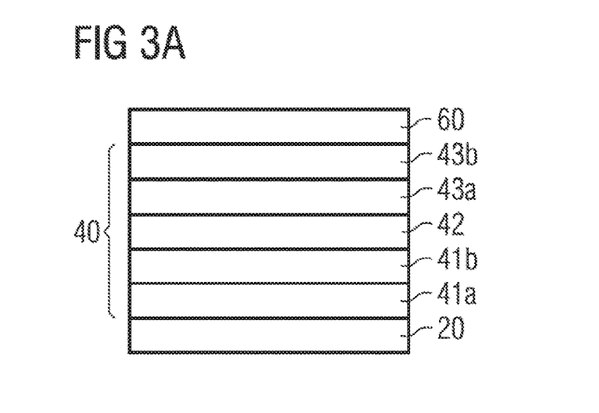
FIG. 3a shows the schematic side view of a charge carrier-generating layer stack.

FIG. 3a shows a schematic side view of a charge carrier-generating layer stack 40 which is arranged between a first electrode 20 and a second electrode 60. In this specific example, the first electrode 20 is formed from ITO, the first electron-transporting layer 41a is formed from undoped NET-18, the second electron-transporting layer 41b contains NET-18 with NDN-26 doping. The intermediate layer 42 is formed from titanium oxide phthalocyanine, the first hole-transporting layer 43a is formed from HAT-CN, the second hole-transporting layer 43b is formed from α-NPD and the second electrode 60 is formed from aluminum.

Figure 3B:
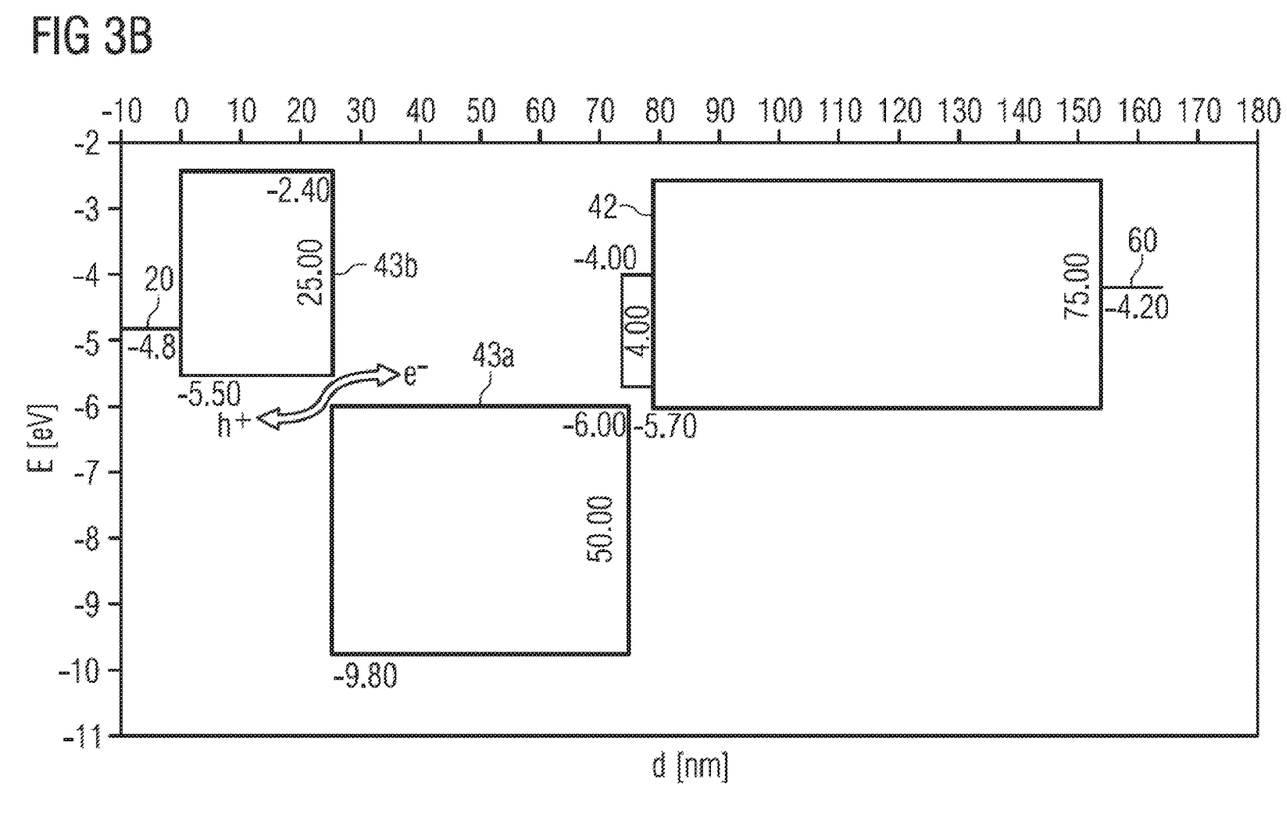
FIG. 3b shows an energy level graph of the charge carrier-generating layer stack.

With reference to this structure, FIG. 3b is an energy level graph showing how the energy ratios of the materials are relative to one another. The graph shows on the x-axis the thickness d in nm and shows on the y-axis the energy E in electron volts. The charge separation or the generation of an electron and of a hole takes place at the α-NPD/HAT-CN boundary surface because the LUMO of HAT-CN is below the HOMO of α-NPD. The hole of the α-NPD is transported to the left to the adjacent emission zone, whereas the electron of HAT-CN is guided via the intermediate layer 42 and the electron-transporting layers 41a and b to the right to the next emission zone. For the electron transport via the high-energy barrier between HAT-CN and NET-18, high n-doping of NET-18 is important. The high n-doping produces in the NET-18 significant band bending and consequently a narrow energy barrier which the electrons can easily tunnel through.

When using naphthalocyanine derivatives of the structural formulas A or B instead of phthalocyanines, the tunnel current can be increased at the same voltage and the charge carrier-generating layer stack can remain stable, that is to say that a high voltage stability can be observed in the load test at high temperature. As a result, the service life of organic light-emitting devices is increased. Furthermore, the transmission in the yellow-red spectral range is advantageously increased.

By virtue of the fact that during vaporization the naphthalocyanine derivatives can be deposited as a continuous layer, the hole-transporting layer 43, e.g. the HAT-CN layer, can still be separated more effectively from the very reactive, possibly n-doped electron-transporting layer 41.

FIGS. 4a and 4b show absorption spectra of various compounds. FIG. 4a shows the absorption spectrum of phthalocyanine and FIG. 4b shows the absorption spectrum of naphthalocyanine (formula A3).

The x-axis represents in each case the wavelength λ in nm and the y-axis represents the absorption A in $10^{-4}$ L mol$^{-1}$ cm$^{-1}$. If the absorption spectrum of phthalocyanine in FIG. 4a is compared with that of naphthalocyanine (formula A3) in figure B, it is apparent that phthalocyanine has two characteristic transitions of the Π-electron system at about 660 nm and 700 nm, whereas the naphthalocyanine (formula A3) has a characteristic transition which is at about 780 nm and therefore in the near infrared range of the electromagnetic spectrum. Therefore, in the case of the compound of formula A3, the absorption in the yellow-red spectral range is lowered in comparison with phthalocyanine.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

This patent application claims the priority of German patent application 102013017361.2, the disclosure content of which is hereby incorporated by reference.

The invention claimed is:

1. An organic light-emitting device comprising a substrate, a first electrode on the substrate, a first organic functional layer stack on the first electrode, a charge carrier-generating layer stack on the first organic functional layer stack, a second organic functional layer stack on the charge carrier-generating layer stack, and a second electrode on the second organic functional layer stack, wherein the charge carrier-generating layer stack comprises at least one hole-transporting layer, at least one electron-transporting layer and at least one intermediate layer, and wherein the at least one intermediate layer comprises a naphthalocyanine derivative wherein the naphthalocyanine derivative comprises the formula A or B Formula A Formula B where $R^1$ and $R^2$, which are arranged in a meta-position with respect to one another, collectively form an aromatic ring system consisting of one, two or three rings, and $M^1$ is Cu, Ag, Zn, Co, Ni, Fe, Mn, Mg, Ca, Sr, Ba, Al, AlCl, SnO, HfO, ZrO, VO or TiO.

2. The device according to claim 1, wherein the naphthalocyanine derivative contains a metal or a metal compound.

3. The device according to claim 2, wherein the metal or the metal compound are selected from a group containing Cu, Ag, Zn, Co, Ni, Fe, Mn, Mg, Ca, Sr, Ba, Al, AlCl, SnO, HfO, ZrO, VO and TiO.

4. The device according to claim 1, wherein the naphthalocyanine derivative is metal-free.

5. The device according to claim 1, wherein the naphthalocyanine derivative comprises the formula B and wherein $M^1$ is Cu, Co, TiO, SnO or VO.

6. The device according to claim 1, wherein the at least one intermediate layer has a thickness which is selected from a range comprising 1 nm to 50 nm.

7. The device according to claim 1, wherein the at least one hole-transporting layer comprises a first hole-transporting layer and a second hole-transporting layer and the first hole-transporting layer is arranged on the at least one electron-transporting layer and the second hole-transporting layer is arranged on the first hole-transporting layer.

8. The device according to claim 7, wherein the at least one intermediate layer is arranged between the at least one electron transporting layer and the first hole-transporting layer and/or between the first hole-transporting layer and the second hole-transporting layer.

9. The device according to claim 7, wherein the at least one hole-transporting layer or the first and second hole-transporting layers are undoped or are p-doped independently of one another.

10. The device according to claim 1, wherein the at least one electron-transporting layer is n-doped.

11. The device according to claim 1, which is formed as an organic light-emitting diode.

12. A method for producing an organic light-emitting device by the method steps of
   A) forming a first organic functional layer stack on a first electrode which is arranged on a substrate,
   B) forming a charge carrier-generating layer stack on the first organic functional layer stack,
   C) forming a second organic functional layer stack on the charge carrier-generating layer stack,
   D) arranging a second electrode on the second organic functional layer stack,
   wherein method step B) comprises the steps of:
      B1) applying at least one electron-transporting layer on the first organic functional layer stack,
      B2) applying a first hole-transporting layer on the electron-transporting layer, and
      B3) applying an intermediate layer wherein the intermediate layer comprises a naphthalocyanine derivative, wherein the naphthalocyanine derivative comprises the formula A or B Formula A Formula B where $R^1$ and $R^2$, which are arranged in a meta-position with respect to one another, collectively form an aromatic ring system consisting of one, two or three rings, and $M^1$ is Cu, Ag, Zn, Co, Ni, Fe, Mn, Mg, Ca, Sr, Ba, Al, AlCl, SnO, HfO, ZrO, VO or TiO.

13. The method according to claim 12, wherein the naphthalocyanine derivative is vapor-deposited or applied as a solution.

* * * * *